US006709718B2

(12) United States Patent
O'Brien

(10) Patent No.: US 6,709,718 B2
(45) Date of Patent: Mar. 23, 2004

(54) POROUS PLASMA TREATED SHEET MATERIAL

(75) Inventor: Jeffrey J. O'Brien, Walworth, NY (US)

(73) Assignee: ExxonMobil Oil Corporation, Fairfax, VA (US)

( * ) Notice: Subject to any disclaimer, the term of this patent is extended or adjusted under 35 U.S.C. 154(b) by 235 days.

(21) Appl. No.: 09/829,734

(22) Filed: Apr. 10, 2001

(65) Prior Publication Data

US 2002/0176946 A1 Nov. 28, 2002

(51) Int. Cl.[7] .............................. H05H 1/46; C08J 7/18; B05D 3/06; B05D 3/12; B05D 5/04
(52) U.S. Cl. .................. 427/538; 427/539; 427/491; 427/536; 427/358
(58) Field of Search ................. 427/488, 491, 427/536, 538, 539, 569, 562, 358

(56) References Cited

U.S. PATENT DOCUMENTS

| | | | |
|---|---|---|---|
| 4,377,616 A | 3/1983 | Ashcraft et al. | 428/213 |
| 4,438,175 A | 3/1984 | Ashcraft et al. | 428/315 |
| 4,445,991 A | 5/1984 | Arbit | 204/168 |
| 4,632,869 A | 12/1986 | Park et al. | 428/315.5 |
| 4,637,851 A | 1/1987 | Ueno et al. | 156/272.6 |
| 4,861,644 A | 8/1989 | Young et al. | 428/195 |
| 5,650,451 A | 7/1997 | Yagi et al. | 521/143 |
| 5,885,721 A | 3/1999 | Su et al. | 428/516 |
| 5,895,558 A * | 4/1999 | Spence | 427/569 |
| 5,981,079 A | 11/1999 | Mount, III et al. | 428/461 |
| 6,083,355 A | 7/2000 | Spence | 204/164 |
| 6,106,659 A | 8/2000 | Spence et al. | 156/345 |
| 6,118,218 A | 9/2000 | Yializis et al. | 315/112.21 |
| 6,528,129 B1 * | 3/2003 | Kondo | 427/536 |

OTHER PUBLICATIONS

S.A. Pirzada, et al., "Plasma Treatment of Polymer Films", 42nd Annual Technical Conference Proceedings, ISSN 0737–5921, Society of Vacuum Coaters, pp. 301–306, 1999. no month.

* cited by examiner

*Primary Examiner*—Marianne Padgett
(74) *Attorney, Agent, or Firm*—Rick F. James

(57) ABSTRACT

A method is provided for surface treating a porous sheet material. The surface treatment involves contacting at least one porous surface of the film with plasma at atmospheric pressure and a plasma generating electrode frequency of greater than 1 MHz. This method provides treatment which penetrates into the pores of the sheet material.

14 Claims, No Drawings

POROUS PLASMA TREATED SHEET MATERIAL

BACKGROUND

A method is provided for surface treating a porous sheet material. The surface treatment involves contacting at least one porous surface of the film with plasma at atmospheric pressure and a plasma generating electrode frequency of greater than 1 MHz. This method provides treatment which penetrates into the pores of the sheet material.

Flame, plasma or corona discharge treatments have been used to improve the printability or metal adhesion properties of film surfaces of polymers, such as polypropylene. These treatments are believed to generate oxygen containing functional groups, such as —OH or —COOH, on exposed surfaces of the film. Plasma treatment in the presence of a hydroxyl-donating material, such as methanol, is described in U.S. Pat. No. 5,981,079.

Flame or corona discharge treatments tend to involve subjecting the treated film surfaces to high temperatures. These high temperatures may tend to melt or distort polymers.

Exposing a porous polymeric film to high temperatures can be particularly problematic. For example, U.S. Pat. No. 5,650,451 states that treatment of a porous biaxially oriented high molecular weight film at a temperature of 132 to 145° C. for one second to ten minutes can result in a loss of specific surface area of 20 $m^2/g$ or more.

SUMMARY

There is provided a method for treating a porous sheet material to render the pore space thereof more hydrophilic, said method comprising contacting said sheet material with plasma under sufficient treating conditions, wherein said treating conditions comprise atmospheric pressure and plasma generating electrode frequency of greater than 1 MHz.

DETAILED DESCRIPTION

The porous sheet material may have an open cell foam structure, a non-woven fiber structure or a woven fiber structure. The open cell foam structure may be described as having a continuous matrix material with a series of interconnected cavities or voids extending from at least one surface of the sheet into a substantial depth, e.g., at least 50 percent, of the sheet. The continuous matrix material may be a thermoplastic material, such as a polyolefin.

The porous sheet material may be a fibrous web substrate, either woven of nonwoven. The fibers may be made of a thermoplastic material, such as a polyolefin, e.g., polyethylene or polypropylene. A particular type of fibrous web material is spunbond polypropylene. Treatment of examples of fibrous web material with various types of plasma is discussed in U.S. Pat. No. 6,106,659.

The porous sheet material may be an extruded film comprising a surface layer of polyolefin and particles of an incompatible material, wherein said layer has a meshed network of polyolefin fibers and striations of layers coplanar with the plane of the film, wherein said layer is porous in a direction perpendicular to the plane of the film and wherein said layer has a void content of at least 20%. Particular examples of such porous sheet materials are described in U.S. Pat. No. 4,861,644.

In U.S. Pat. No. 4,861,644, the microporous material substrate comprises (1) a matrix consisting essentially of linear ultrahigh molecular weight polyolefin, (2) a large proportion of finely divided water-insoluble siliceous filler, and (3) interconnecting pores.

As pointed out in U.S. Pat. No. 4,861,644, inasmuch as ultrahigh molecular weight (UHMW) polyolefin is not a thermoset polymer having an infinite molecular weight, it is technically classified as a thermoplastic. However, because the molecules are essentially very long chains, UHMW polyolefin, and especially UHMW polyethylene, softens when heated but does not flow as a molten liquid in a normal thermoplastic manner. In U.S. Pat. No. 4,861,644, it is stated that the very long chains and the peculiar properties they provide to UHMW polyolefin are believed to contribute in large measure to the desirable properties of the microporous material substrate.

In view of the flow characteristics of UHMW polyethylene, it is difficult to process into the form of a film. As described in U.S. Pat. No. 4,861,644, a processing plasticizer is blended with UHMW polyethylene and precipitated silica to improve film forming characteristics. Examples of such processing plasticizers include processing oil such as paraffinic oil, naphthenic oil, or aromatic oil. After the film is formed the processing plasticizer is removed by an extraction step.

A particular process for forming the film of U.S. Pat. No. 4,861,644 involves mixing filler, thermoplastic organic polymer powder, processing plasticizer and minor amounts of lubricant and antioxidant until a substantially uniform mixture is obtained. The weight ratio of filler to polymer powder employed in forming the mixture is essentially the same as that of the microporous material substrate to be produced. The mixture, together with additional processing plasticizer, is introduced to the heated barrel of a screw extruder. Attached to the extruder is a sheeting die. A continuous sheet formed by the die is forwarded without drawing to a pair of heated calender rolls acting cooperatively to form continuous sheet of lesser thickness than the continuous sheet exiting from the die. The continuous sheet from the calender then passes to a first extraction zone where the processing plasticizer is substantially removed by extraction with an organic liquid which is a good solvent for the processing plasticizer, a poor solvent for the organic polymer, and more volatile than the processing plasticizer. Usually, but not necessarily, both the processing plasticizer and the organic extraction liquid are substantially immiscible with water. The continuous sheet then passes to a second extraction zone where the residual organic extraction liquid is substantially removed by steam and/or water. The continuous sheet is then passed through a forced air dryer for substantial removal of residual water and remaining residual organic extraction liquid. From the dryer the continuous sheet, which is microporous material substrate, is passed to a take-up roll.

After the processing plasticizer is extracted from the film, biaxial stretching may, optionally, take place.

A microporous substrate described in U.S. Pat. No. 4,861,644, or a substrate similar thereto, is believed to be commercially available from PPG Industries, Inc., under the tradename Teslin.

Methods for making films with a surface layer with an open cell pore structure are described in U.S. application Ser. No. 09/079,807, filed May 15, 1998. According to this method a cavitating agent is used with a particular polymeric matrix material, which is high density polyethylene (HDPE) or medium density polyethylene (MDPE). When this material is stretched, separations which form voids are formed not only horizontally, i.e. within or parallel to the plane of the film, but also in the vertical dimension or perpendicular to the plane of the film.

As the term high density polyethylene (HDPE) is used herein, it is defined to mean an ethylene-containing polymer having a density of 0.940 or higher. (Density (d) is expressed as g/cm$^3$.) It is noted that the tensile strength of HDPE increases when the density of HDPE increases. One particularly suitable HDPE is the resin sold as M6211 by Equistar. Another particularly suitable HDPE is the resin sold as HDZ128 by Exxon. Other HDPE resins include, for example, BDM 94-25 available from Fina Oil and Chemical Co. Dallas, Tex., and 19C and 19F available from Nova Corporation, Sarnia, Ontario, Canada.

The term "medium density polyethylene" (MDPE) as used herein is defined to mean an ethylene-containing polymer having a density of from about 0.926 to about 0.940. MDPE is readily available, e.g., Dowlex™2038 or Dowlex™2027A from The Dow Chemical Company.

An incompatible material, also referred to herein as a cavitating agent, is blended with HDPE or MDPE to provide a voided layer. Such agents may be added to the HDPE or MDPE prior to extrusion and are capable of generating voids (cavities) in the structure of the film during the film-making process. It is believed that small inhomogeneities introduced into the HDPE or MDPE layer by the cavitating agent result in points of weakness in the polyethylene sheet. The biaxially orienting step then induces separations in the HDPE or MDPE layer, causing cavitation in the processed film. As mentioned previously, the separations in the core layer vary in size and are formed not only horizontally, i.e., within or parallel to the plane of the film, but also in the vertical dimension or perpendicular to the plane of the film.

Inorganic cavitating agents, especially hydrophilic inorganic cavitating agents, may be used. Hydrophilic cavitating agents are particularly suited for substrates which are intended to be receptive to water. A preferred cavitating agent is calcium carbonate (CaCO$_3$).

Organic cavitating agents, such as polystyrene and polybutylene terephthalate (PBT), may be used. When used, the organic cavitating agents may be extremely finely divided and resistant to melting at operating temperatures in order to produce the desired degree of inhomogeneity in the polymer sheet. Crosslinked polymeric cavitating agents tend to be particularly melt resistant. Cavitating agents can be included using methods known in the art, such as those described in U.S. Pat. Nos. 4,377,616 and 4,632,869, incorporated herein by reference.

The percentage of cavitating agent included in the HDPE or MDPE layer, based on the entire weight of the layer, may be from 2 wt % to 40 wt %, for example, from 4 wt % to 24 wt %, e.g., from 7 wt % to 18 wt %, especially when CaCO$_3$ is used.

The blend of HDPE or MDPE and cavitating agent may be passed through a flat sheet extruder die at a temperature ranging from about 230° C. to about 280° C. This layer may be coextruded with one or more backing layers to form a multi-layer film. The extruded layers may be cast onto a cooling drum, quenched and stretched to achieve biaxial orientation.

For example, blends of HDPE and 5 to 10 wt % CaCO$_3$ may be cast at a temperature between 160–180° F. (71–82° C.) depending upon the thickness of the sheet, i.e. the caster temperature may be higher for thicker sheets and lower for thinner sheets. In addition, each film may be stretched in the machine direction at a temperature about 245–250° F. (118–121° C.) and in the transverse direction at about 262° F. (128° C.).

Conventional casting apparatus may be used to prepare the present film. For example, cast extrusion may use a standard multi-roll stack system or a cast roll with an air cap (high velocity air applied to the outside of the sheet). A cast roll and water bath system may be used, although this type of system can affect film clarity, generally yielding a rougher and more opaque film.

Biaxial orientation of the present film tends to more evenly distribute strength qualities of a film in the longitudinal or "machine direction" (MD) of the film and in the lateral or "transverse direction" (TD) of the film. Biaxial oriented films tend to be stiffer and stronger, and also exhibit much better resistance to flexing and folding forces.

Biaxial orientation can be conducted simultaneously in both directions, however, it is expensive to employ apparatus having the ability to do this. Therefore, most biaxial orientation processes use apparatus which stretches the films sequentially, first in one direction and then in the other, preferably in the MD first and then in the TD. A discussion of high biaxial orientation of polyethylene films is provided in U.S. Pat. No. 5,885,721. The present films may, for example, be stretched in the MD from about 5:1 to about 8:1 and in the TD from about 6:1 to about 15:1.

The present film may have more than one cavitated layer. For example, such a three layer film may have a cavitated HDPE surface layer, a cavitated HDPE core layer and a noncavitated (i.e. void free) thermoplastic skin layer.

When the cavitated surface layer is coextruded with one or more noncavitated backing layers, the film is more suited to biaxial orientation, especially in the transverse direction (TD). In particular, without the backing layer, the cavitated surface layer is prone to tearing when cavitated portions are secured by clamps, clips or hooks of a center frame and then stretched, especially under the conditions and processing rates used in commercial scale operations.

A non-cavitated backing layer may be separated from an open celled film layer by a simple peeling action. Such separation may take place without much resistance. Peeling the backing layer off of the cavitated surface layer may result in a film which is porous form one surface to the other in a direction perpendicular to the film.

Thinner backing layers, e.g., having a thickness of 0.05 mil or less, tend to be easier to peel off the back of a cavitated layer than thicker backing layers, e.g., having a thickness of greater than 0.05 mil.

There is no particular limit to the number of layers. Films with at least 5 layers may be prepared by coextrusion techniques. Films with more than 5 layers may be prepared by laminating together two or more multi layer films. Particular examples of films include those with a porous surface layer and two or three nonporous backing layers.

The backing layer material may be polypropylene, HDPE or another polymer that can be coextruded with the rest of the film structure (i.e. the cavitated porous layers). For example the backing layer material may be polypropylene homopolymer, EP copolymer, EPB terpolymer, HDPE, LPDE and other polymers.

Backing layer(s) may be made with various barrier polymers, and/or coated with various barrier polymers, to obtain a barrier layer. Examples of such barrier polymers include polyvinylidene chloride (PVDC) and polyvinyl alcohol (PVOH). The barrier layer may, optionally, be metallized or coated with other materials, such as silica.

Each of the cavitated layer(s) and backing layer(s) may optionally include various additives. Such additives include, but are not limited to, anti-blocks, anti-static agents, coefficient of friction (COF) modifiers, processing aids, colorants, clarifiers, and other additives known to those skilled in the art.

The present cavitated HDPE or MDPE layers may each have a lofting value of at least 3, for example, about 5. Lofting value is defined herein as the thickness ratio achieved by dividing the thickness of the layer achieved with the cavitating agent by the thickness of the layer (with the same amount of polymer) achieved in the absence of the cavitating agent.

In view of the random matrix structure of the present cavitated HDPE layers, it is difficult to precisely measure the average pore diameter of these layers. However, average pore diameter may be estimated by observation of the film under a scanning type electron microscope. In general terms, these cavitated HDPE or MDPE layers may have an average pore diameter of 0.1 to 10 microns, for example, from 0.1 to 2 microns.

These cavitated HDPE or MDPE layers may have a void content (also referred to herein as porosity) of at least 20%, e.g., 20–85%, preferably at least 50%. Porosity is measured by dividing $(T_1-T_2)$ by $T_1$ and multiplying this fraction by 100, wherein $T_1$ is the thickness of the cavitated layer and $T_2$ is the thickness of the layer in the absence of cavitation. $T_2$ may be calculated on the basis of the density of the HDPE or MDPE.

As described in U.S. Pat. Nos. 4,861,644 and 5,650,451, the polymeric matrix materials in open celled layers may be composed of ultrahigh molecular weight polyethylene or high molecular weight polyethylene. However, the present polymeric matrix materials in the open celled layers may also be composed of polymers other than ultrahigh molecular weight polyethylene or high molecular weight polyethylene. Indeed, the present open celled layers may be substantially free of any such ultrahigh molecular weight polyethylene or high molecular weight polyethylene. For the purposes of the present disclosure and the claims which follow, the above-mentioned expression "substantially free" is intended to connote that no such ultrahigh or high molecular weight polymers are intentionally added to the polymeric matrix, but they may be present as unintended impurities in very small amounts, e.g., less than one wt % of the total polymer in the polymeric matrix.

The polyethylene used to form the present open celled film layers may have one or more (for example, all) of the following properties: (1) a molecular weight of less than 250,000; (2) an intrinsic viscosity of less than 5 dl/g, for example, less than 4 dl/g or even 3.5 dl/g (e.g., as measured by the method described in U.S. Pat. No. 5,650,451); and (3) an ASTM D 1238–86 condition E melt index of from 0.4 to about 4, e.g., from 0.5 to about 1.5, grams/10 minutes.

For the above-mentioned ASTM values, it will be understood that condition E may also be expressed as ASTM D 1238-190-2 and involves a temperature of 190° C. and a top load of 2 kg, and condition L may also be expressed ASTM D 1238-230-2 and involves a temperature of 230° C. and a top load of 2 kg.

Unlike the high molecular weight polymers in the cavitated layers described in U.S. Pat. Nos. 4,861,644 and 5,650,451, the present lower molecular weight polymeric matrix materials need not be combined with a plasticizer or processing aid, such as a paraffin wax. Consequently, the present cavitated layers, made from lower molecular weight polymers, do not need to be subjected to an extraction treatment to remove the plasticizer. Furthermore, as pointed out in U.S. Pat. No. 5,650,451 at column 11, lines 59–64, even after an extraction treatment, up to 5 wt % of residual plasticizer can remain in the film. The present cavitated layers, prepared without a plasticizer, are obviously totally free of residual plasticizer.

Polyolefins, such as polyethylene and polypropylene, are inherently hydrophobic. The surfaces of these polymers must be treated to render these surfaces hydrophilic. Such treatments for making the surfaces of non-cavitated polyolefin films more hydrophilic include flame treatment and corona treatment. However, flame treatment and corona treatment tend to generate heat sufficient to melt polymers and damage the present open celled cavitated film surface. Furthermore, flame treatment and corona treatment are not well suited for penetrating the pore structure of open celled cavitated films.

To render an open celled porous film made from a polyolefin water absorbent, it is necessary to treat not only the outer surface of the film but also the inner surfaces of the pores. It has been discovered that certain types of plasma treatments are suited for this purpose. The plasma is a gas with relatively high concentrations of ions, free radicals, and free electrons. Under the right conditions it can penetrate into the pores and react with their interior surfaces.

Plasma treatment may take place under atmospheric conditions, i.e. conditions where a vacuum is not applied during treatment. Such atmospheric plasma treatments are described in U.S. Pat. No. 6,118,218 and in an article by S. A. Pirzada, A. Yializis, W. Decker and R. E. Ellwanger, entitled "Plasma Treatment of Polymer Films", Society of Vacuum Coaters 42$^{nd}$ Annual Technical Conference Proceedings, Chicago, 1999, pp. 301–306. By means of this atmospheric plasma treatment, it is possible to apply plasma to the cavitated polyolefin surface at a temperature less than the melting point of the polyolefin, e.g., less than 130° C. or even less than 100° C. Equipment for making such plasma treatments at or near atmospheric pressures is available from Sigma Technologies International, Inc., 10960 N. Stallard Place, Tucson, Ariz. An operating frequency of 40 kHz is recommended for plasma treatment of polymer surfaces.

An advantage of the atmospheric plasma treatment is that it can take place under conditions insufficient to generate enough heat to melt polymers or otherwise distort the structure of the film, especially the cavitated portions thereof. By way of contrast, U.S. Pat. No. 5,650,451 states that treatment of a biaxially oriented high molecular weight film at a temperature of 132 to 145° C. for one second to ten minutes can result in a loss of specific surface area of 20 m$^2$/g or more.

In order to assure better penetration of plasma into the pores of the treated sheet material, it has been discovered that the operating frequency should be rather high. In particular, the frequency of the plasma generating electrode should be greater than 1 MHz, more prefereably, at least 5 MHz, for example, from 5 MHz to 20 MHz. However, it will be understood that at least some plasma penetration can occur at lower frequencies, such as from 20 to 40 kHz.

The plasma treating gas may include one or more of a variety of gases including oxygen, nitrogen, air, carbon dioxide, methane and other inert or reactive gases. For example, an oxygen containing gas, such as $O_2$, $CO_2$ or air, may be used alone or, optionally, in admixture with an inert gas, such as argon or helium.

By providing a treatment which penetrates substantially into the pores of the film, the plasma treatment is not substantially disturbed when the treated film is wound, according to standard manufacturing practices, into a roll and, subsequently, unwound for use or further treatment.

EXAMPLE 1

This Example describes the preparation of a cavitated HDPE film having an open celled pore structure.

A three layer porous HDPE film was prepared. The film structure included a top porous skin layer A, and porous core layer B, and a bottom skin layer C.

The top porous skin layer A included 90 wt % HDPE (Exxon 7845.30) as the polymer matrix material, 9 wt % $CaCO_3$ and 1 wt % fluoropolymer as an internal lubricant. The $CaCO_3$ and fluoropolymer were both added in the form of a masterbatch with the polymer matrix material. More particularly, the top porous skin layer A included 79 wt % HDPE (Exxon 7845.30) as the polymer matrix material, 18 wt % $CaCO_3$ masterbatch containing 50 wt % $CaCO_3$, and 1 wt % fluoropolymer as an internal lubricant.

The porous core layer B included 94 wt % HDPE (Exxon 7845.30) as the polymer matrix material, and 6 wt % $CaCO_3$. The $CaCO_3$ was both added in the form of a masterbatch with the polymer matrix material. More particularly, the porous core layer B included 88 wt % HDPE (Exxon 7845.30) as the polymer matrix material, and 12 wt % $CaCO_3$ masterbatch containing 50 wt % $CaCO_3$.

The bottom skin layer was a medium density polyethylene (MDPE) (Dowlex 2027A) with a minor amount of antiblock additives.

The total polymer gauge (without cavitation) is 1.4 mil. The cavitated film gauge after biaxial orientation was 4.5 mil. The total polymer gauge can be calculated from the polymer weight and density.

The polymer mixtures of the layers were extruded at around 250° C. into a base sheet, which is then stretched 5 times in the machine direction (MD) and 8 times in the transitional direction (TD).

EXAMPLE 2

The porous surfaces of two film samples (i.e. Sample 1 and Sample 2), prepared according to the procedure of Example 1, were treated with plasma at atmospheric conditions. The plasma gas was 100% oxygen.

Each film sample was treated with plasma generated at two different frequencies, i.e. 40 kHz and 13.5 MHz. Electron Spectroscopy for Chemical Analysis (ESCA) was used to measure the elements present after treatment, in terms of atomic equivalents of total oxygen (O); total carbon (C); carbon singly bound to carbon or hydrogen [C—(C,H)]; hydroxyl and ether groups [C—(O,N)]; carbonyl groups (C=O); and ester and carboxylic acid groups (O—C=O).

Results are summarized in Table 1. In Table 1 all percentages are atom percents.

TABLE 1

| Sample No. | Frequency | O % | C % | C—(C,H) % | C—(O,N) % | C=O % | O—C=O % |
|---|---|---|---|---|---|---|---|
| 1 | 13.5 MHz | 11.4 | 87.3 | 78 | 5 | 2 | 2 |
| 1 | 40 kHz | 18.2 | 79.4 | 64 | 9 | 4 | 2 |
| 2 | 13.5 MHz | 11.2 | 87.9 | 79 | 4 | 2 | 2 |
| 2 | 40 kHz | 17.3 | 81.6 | 65 | 9 | 4 | 4 |

Table 1 illustrates that in all cases the 40 kHz treatment had a higher level of oxygen and a higher level of oxygen-bonding atoms vs. the 13.5 frequency plasma treatment. Similar results were obtained when a non-porous polypropylene film was treated with 40 kHz and 13.5 MHz plasma.

EXAMPLE 3

Film samples, prepared according to the procedure of Example 1, were treated with plasma according to the treatment procedures described in Example 2.

These treated samples were tested for water wicking according to the Cahn Wicking test. Total water wicking was greater for the samples treated at 40 kHz, as compared with the samples prepared at 13.5 MHz. For example, as explained in Example 7, hereinafter, when a film sample treated at 40 kHz was tested for water wicking, its weight increased by 253.00 mg. However, when an equivalent sample treated at 13.5 MHz was tested, the weight increased by only 153.09 mg.

As expected, for a given frequency, increased power and increased treatment time resulted in increased water wicking.

EXAMPLE 4

The wicking tests of Example 3 were repeated, except that dye and pigment based inks were wicked into the samples instead of water. For the most part, the 40 kHz treated film absorbed the most weight of ink. However, the difference in weights was not as great as with water.

EXAMPLE 5

Film samples, prepared according to the procedure of Example 1, were treated with plasma according to the treatment procedures described in Example 2.

These treated samples were tested for ink drying time with various inks, including a hard to dry low humectant, ink applied by ink jet printing. Ink drying time was less for the samples treated with the 13.5 MHz frequency plasma.

EXAMPLE 6

Film samples (i.e. Samples 3–6), prepared according to the procedure of Example 1, were treated with plasma according to the treatment procedures described in Example 2.

These treated samples were tested for ink infiltration. In particular, a cut cross section of inkjet printed film was viewed on an optical microscope to compare how far the ink soaked into the film. Infiltration percent was measured by multiplying the depth of ink penetration by 100 and dividing by the total film thickness.

Results are summarized in Table 2. This Table also reports the maximum amount of ink wicking for both dye ink and pigment ink.

TABLE 2

| Sample No. | Plasma Frequency | Max Dye Wicking | Dye Ink Infiltration | Max Pigment Wicking | Pigment Ink Infiltration |
|---|---|---|---|---|---|
| 3 | 40 kHz | 181.92 | 13.27% | 156.06 | 39.47% |
| 3 | 13.5 MHz | 170.10 | 40.00% | 160.05 | 58.08% |
| 4 | 40 kHz | 173.10 | 13.19% | 156.58 | 26.66% |
| 4 | 13.5 MHz | 164.27 | 22.64% | 150.23 | 25.48% |
| 5 | 40 kHz | 199.87 | 11.92% | 175.44 | 36.49% |
| 5 | 13.5 MHz | 181.67 | 30.77% | 160.39 | 34.61% |
| 6 | 13.5 MHz | 190.04 | 30.28% | 165.12 | 46.51% |

The test results summarized in Table 2 demonstrate that the 13.5 MHz frequency treatment allows ink to penetrate deeper into the film, especially when dye inks are used.

EXAMPLE 7

Samples of the film of Example 1, corona treated or treated with plasma at a frequency of 40 kHz, were tested to measure water absorption into the film by the Cahn Wicking test. This test dips a one inch sample of film into a beaker of water and continuously measures the weight of the sample. The initial weight is set to zero and the weight gain or loss is the amount of water absorbed by the sample. If the sample is hydrophobic and has a density less than water, the sample measurement will be negative because of buoyancy. If the sample hydrophilic and has a density less than water, the sample measurement will start out negative and after some time, as water is absorbed into the sample, end up positive. If the sample is hydrophilic and has a density less than water, the sample measurement could always be positive, if the absorption rate is fast.

In the wicking test, the corona treated sample gave an initial water absorption value of −27.5 mg and a maximum water absorption value of 9.82 mg. These values indicate that the corona treatment failed to make the sample hydrophilic.

In the same wicking test, the plasma treated sample gave an initial water absorption value of 231.72 mg and a maximum water absorption value of 253.00 mg. These values indicate that the plasma treatment made the sample hydrophilic.

EXAMPLE 8

A sample of the Teslin™ film, available from PPG Industries, Inc., was treated with plasma at a frequency of 40 kHz, and tested to measure water absorption into the film by the Cahn Wicking test. An untreated sample was also tested by this test.

In the wicking test, the untreated Teslin™ sample gave an initial water absorption value of −399.27 mg and a maximum water absorption value of −372.63 mg. These values indicate that the untreated sample was very hydrophobic.

In the same wicking test, the plasma treated Teslin™ sample gave an initial water absorption value of 150.72 mg and a maximum water absorption value of 181.27 mg. These values indicate that the plasma treatment made the sample hydrophilic.

What is claimed is:

1. A method for treating a porous sheet material comprising at least one porous surface to render pore space thereof more hydrophilic, said method comprising contacting at least one porous surface of said sheet material with plasma under plasma treating conditions, wherein said plasma treating conditions comprise atmospheric pressure and plasma generating electrode frequency of greater than 5 MHz, wherein said porous sheet material is an extruded film comprising a surface layer of polyolefin and particles of a cavitating agent, wherein said layer has a meshed network of polyolefin fibers and striations of layers coplanar with the plane of the film, wherein said layer is porous in a direction perpendicular to the plane of the film and wherein said layer has a void content of at least 20%.

2. A method according to claim 1, wherein said sheet material has an open cell foam structure, a non-woven fiber structure or a woven fiber structure.

3. A method according to claim 1, wherein said film is biaxially stretched, wherein said polyolefin is high density polyethylene (HDPE) and said cavitating agent is calcium carbonate, and wherein said HDPE has a density of 0.940 g/cm$^3$ or higher.

4. A method according to claim 3, wherein said film comprises a nonporous skin layer.

5. A method according to claim 4, wherein said nonporous skin layer is peelable.

6. A method according to claim 4, wherein said surface layer is treated with plasma at a temperature below the melting point of said HDPE.

7. A method according to claim 4, wherein said film is a three-layer film comprising a core layer of high density polyethylene (HDPE) and particles of calcium carbonate, wherein both said surface layer and said core layer have a meshed network of HDPE fibers and striations of layers coplanar with the plane of the film, wherein both said surface layer and said core layer are porous in a direction perpendicular to the plane of the film, and wherein both said surface layer and said core layer have a void content of at least 20%.

8. A method according to claim 1, wherein said film is a three-layer film comprising a porous surface layer and two nonporous backing layers.

9. A method according to claim 1, wherein said film is a four-layer film comprising a porous surface layer and three nonporous backing layers.

10. A method according to claim 1, wherein a reactive gas is used to generate said plasma, and wherein said reactive gas is an oxygen containing gas selected from the group consisting of $O_2$, $CO_2$ and air.

11. A method according to claim 10, wherein the reactive gas used alone.

12. A method according to claim 10, wherein the reactive gas used in admixture with an inert gas.

13. A method according to claim 3, wherein said polyethylene has a molecular weight of less than 250,000.

14. A method according claim 13, wherein said polyethylene has an intrinsic viscosity of less than 5 dl/g and an ASTM D 1238–86 condition E melt index of from 0.4 to about 4 grams/10 minutes.

* * * * *